United States Patent
Yamazaki et al.

(10) Patent No.: US 9,871,187 B2
(45) Date of Patent: Jan. 16, 2018

(54) LEAD-FREE PIEZO-ELECTRIC PORCELAIN COMPOSITION, PIEZO-ELECTRIC ELEMENT USING THE SAME, AND METHOD FOR PRODUCING LEAD-FREE PIEZO-ELECTRIC PORCELAIN COMPOSITION

(71) Applicant: NGK SPARK PLUG CO., LTD., Nagoya-shi, Aichi (JP)

(72) Inventors: Masato Yamazaki, Komaki (JP); Takayuki Matsuoka, Aichi (JP); Yoshiteru Honda, Ise (JP); Kazuaki Kitamura, Ise (JP); Hisashi Kozuka, Ichinomiya (JP); Toshiaki Kurahashi, Konan (JP); Yasuyuki Okimura, Inuyama (JP); Hideto Yamada, Komaki (JP); Kazushige Ohbayashi, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 476 days.

(21) Appl. No.: 14/682,631

(22) Filed: Apr. 9, 2015

(65) Prior Publication Data
US 2015/0295162 A1    Oct. 15, 2015

(30) Foreign Application Priority Data
Apr. 11, 2014 (JP) ................... 2014-081770

(51) Int. Cl.
*H01L 41/187* (2006.01)
*H01L 41/43* (2013.01)
*C04B 35/495* (2006.01)

(52) U.S. Cl.
CPC ....... *H01L 41/1873* (2013.01); *C04B 35/495* (2013.01); *H01L 41/43* (2013.01);
(Continued)

(58) Field of Classification Search
CPC .... H01L 41/1873; H01L 41/43; B04B 35/495
See application file for complete search history.

(56) References Cited

U.S. PATENT DOCUMENTS 7,893,601 B2 * 2/2011 Kaigawa ............... C01G 33/006
                                               252/62.9 PZ
9,450,173 B2 * 9/2016 Hatano ................ H01L 41/1873
(Continued)

FOREIGN PATENT DOCUMENTS

EP    2733131 A1   5/2014
JP    2001240471 A   9/2001
(Continued)

OTHER PUBLICATIONS

Extended European Search Report dated Oct. 16, 2015 by the European Patent Office in corresponding European Application No. 15163171.0.

*Primary Examiner* — J. San Martin
(74) *Attorney, Agent, or Firm* — Sughrue Mion, PLLC

(57) ABSTRACT

A lead-free piezo-electric porcelain composition which contains a main phase having voids and which is formed of a first crystal phase composed of an alkali niobate/tantalate-based perovskite oxide having piezo-electric characteristics; and a sub-phase containing a second crystal phase composed of an $A_2B_6O_{13}$-based compound (where the element A is a monovalent element and the element B is one or more divalent to hexavalent elements). The sub-phase fills voids present in the main phase.

11 Claims, 13 Drawing Sheets

(52) U.S. Cl.
CPC .......... *C04B 2235/3201* (2013.01); *C04B 2235/3203* (2013.01); *C04B 2235/3206* (2013.01); *C04B 2235/3208* (2013.01); *C04B 2235/3213* (2013.01); *C04B 2235/3215* (2013.01); *C04B 2235/3217* (2013.01); *C04B 2235/3225* (2013.01); *C04B 2235/3232* (2013.01); *C04B 2235/3244* (2013.01); *C04B 2235/3251* (2013.01); *C04B 2235/3258* (2013.01); *C04B 2235/3262* (2013.01); *C04B 2235/3272* (2013.01); *C04B 2235/3275* (2013.01); *C04B 2235/3284* (2013.01); *C04B 2235/602* (2013.01); *C04B 2235/768* (2013.01); *C04B 2235/80* (2013.01)

(56) References Cited

U.S. PATENT DOCUMENTS

| | | | |
|---|---|---|---|
| 2006/0066180 A1* | 3/2006 | Nanataki | B41J 2/14233 310/358 |
| 2011/0156540 A1 | 6/2011 | Hatano et al. | |
| 2012/0146462 A1 | 6/2012 | Yamazaki et al. | |
| 2014/0139070 A1 | 5/2014 | Yamazaki et al. | |
| 2017/0141292 A1* | 5/2017 | Kozuka | H01L 41/1873 |
| 2017/0141293 A1* | 5/2017 | Kozuka | H01L 41/1873 |

FOREIGN PATENT DOCUMENTS

| | | | | |
|---|---|---|---|---|
| JP | WO 2010134604 A1 * | 11/2010 | | C04B 35/495 |
| JP | 2011-190146 A | 9/2011 | | |
| JP | 5214373 B2 | 6/2013 | | |
| WO | 2013/008418 A1 | 1/2013 | | |

* cited by examiner

FIG. 3A

Influence of sub-phase ratio (No. 1)

| Sample | First crystal phase (base phase) | | | | (K$_a$Na$_b$Li$_c$C1$_{d1}$C2$_{d2}$)(O1$_{f1}$D2$_{f2}$D3$_{f3}$E1$_{g1}$E2$_{g2}$E3$_{g3}$)O$_h$ | | | | | | | | | | | | Second crystal phase (sub-phase) A$_x$B$_y$O$_{13}$ | | |
|---|---|---|---|---|---|---|---|---|---|---|---|---|---|---|---|---|---|---|---|
| | Element C | Element D | Element E | a | b | c | Coefficient d of element C | | e | Coefficient f of element D | | | Coefficient g of element E | | | Sub-phase ratio (vol%) | Element A | Element B |
| | | | | | | | d1 | d2 | | f1 | f2 | f3 | g1 | g2 | g3 | | | |
| S01(*) | — | Nb | — | 0.460 | 0.480 | 0.040 | 0 | 0 | 1.00 | 1.000 | 0 | 0 | 0 | 0 | 0 | 0 | — | — |
| S02 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 0.10 | K, Na, Li | Ti, Nb, Fe, Mg |
| S03 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 0.34 | K, Na, Li | Ti, Nb, Fe, Mg |
| S04 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 0.80 | K, Na, Li | Ti, Nb, Fe, Mg |
| S05 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 1.24 | K, Na, Li | Ti, Nb, Fe, Mg |
| S06 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 1.39 | K, Na, Li | Ti, Nb, Fe, Mg |
| S07 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 1.42 | K, Na, Li | Ti, Nb, Fe, Mg |
| S08 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 1.90 | K, Na, Li | Ti, Nb, Fe, Mg |
| S09 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 2.43 | K, Na, Li | Ti, Nb, Fe, Mg |
| S10 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 3.54 | K, Na, Li | Ti, Nb, Fe, Mg |
| S11 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 4.42 | K, Na, Li | Ti, Nb, Fe, Mg |
| S12 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 5.30 | K, Na, Li | Ti, Nb, Fe, Mg |
| S13 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 0.08 | K, Na, Li | Ti, Nb, Mg |
| S14 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 0.31 | K, Na, Li | Ti, Nb, Mg |
| S15 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 0.77 | K, Na, Li | Ti, Nb, Mg |
| S16 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 1.28 | K, Na, Li | Ti, Nb, Mg |
| S17 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 1.31 | K, Na, Li | Ti, Nb, Mg |
| S18 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 1.45 | K, Na, Li | Ti, Nb, Mg |
| S19 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 1.88 | K, Na, Li | Ti, Nb, Mg |
| S20 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 2.56 | K, Na, Li | Ti, Nb, Mg |
| S21 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 3.41 | K, Na, Li | Ti, Nb, Mg |
| S22 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 4.70 | K, Na, Li | Ti, Nb, Mg |
| S23 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 5.60 | K, Na, Li | Ti, Nb, Mg |

FIG.3B

Influence of sub-phase ratio (No. 2)

| Sample | First crystal phase (main phase) Composition | Second crystal phase (sub-phase) Ratio of sub-phase (vol%) | Second crystal phase (sub-phase) Composition : $A_2B_6O_{13}$ | Relative dielectric constant $\varepsilon_{33}^T/\varepsilon_0$ | Piezo-electric constant $d_{33}$ (pC/N) | Electro-mechanical coupling coefficient $k_r$ | Room-temperature phase transition point | Polarizability under high electric field |
|---|---|---|---|---|---|---|---|---|
| S01(*) | Fig. 3A | 0 | — | 430 | 110 | 0.32 | present | × |
| S02 | as above | 0.10 | (K,Na,Li)$_2$(Ti, Nb, Fe, Mg)$_6$O$_{13}$ | 1090 | 91 | 0.27 | absent | ○ |
| S03 | as above | 0.34 | (K,Na,Li)$_2$(Ti, Nb, Fe, Mg)$_6$O$_{13}$ | 1380 | 205 | 0.45 | absent | ○ |
| S04 | as above | 0.80 | (K,Na,Li)$_2$(Ti, Nb, Fe, Mg)$_6$O$_{13}$ | 1635 | 278 | 0.50 | absent | ○ |
| S05 | as above | 1.24 | (K,Na,Li)$_2$(Ti, Nb, Fe, Mg)$_6$O$_{13}$ | 1710 | 306 | 0.52 | absent | ○ |
| S06 | as above | 1.33 | (K,Na,Li)$_2$(Ti, Nb, Fe, Mg)$_6$O$_{13}$ | 1870 | 321 | 0.57 | absent | ○ |
| S07 | as above | 1.42 | (K,Na,Li)$_2$(Ti, Nb, Fe, Mg)$_6$O$_{13}$ | 1820 | 312 | 0.54 | absent | ○ |
| S08 | as above | 1.90 | (K,Na,Li)$_2$(Ti, Nb, Fe, Mg)$_6$O$_{13}$ | 1715 | 288 | 0.51 | absent | ○ |
| S09 | as above | 2.43 | (K,Na,Li)$_2$(Ti, Nb, Fe, Mg)$_6$O$_{13}$ | 1620 | 256 | 0.50 | absent | ○ |
| S10 | as above | 3.54 | (K,Na,Li)$_2$(Ti, Nb, Fe, Mg)$_6$O$_{13}$ | 1550 | 204 | 0.43 | absent | ○ |
| S11 | as above | 4.42 | (K,Na,Li)$_2$(Ti, Nb, Fe, Mg)$_6$O$_{13}$ | 1540 | 200 | 0.43 | absent | ○ |
| S12 | as above | 5.30 | (K,Na,Li)$_2$(Ti, Nb, Fe, Mg)$_6$O$_{13}$ | 1260 | 122 | 0.32 | absent | ○ |
| S13 | as above | 0.08 | (K,Na,Li)$_2$(Ti, Nb, Mg)$_6$O$_{13}$ | 1070 | 87 | 0.27 | absent | ○ |
| S14 | as above | 0.31 | (K,Na,Li)$_2$(Ti, Nb, Mg)$_6$O$_{13}$ | 1290 | 200 | 0.45 | absent | ○ |
| S15 | as above | 0.77 | (K,Na,Li)$_2$(Ti, Nb, Mg)$_6$O$_{13}$ | 1645 | 280 | 0.50 | absent | ○ |
| S16 | as above | 1.26 | (K,Na,Li)$_2$(Ti, Nb, Mg)$_6$O$_{13}$ | 1700 | 295 | 0.51 | absent | ○ |
| S17 | as above | 1.31 | (K,Na,Li)$_2$(Ti, Nb, Mg)$_6$O$_{13}$ | 1780 | 298 | 0.55 | absent | ○ |
| S18 | as above | 1.45 | (K,Na,Li)$_2$(Ti, Nb, Mg)$_6$O$_{13}$ | 1720 | 284 | 0.50 | absent | ○ |
| S19 | as above | 1.88 | (K,Na,Li)$_2$(Ti, Nb, Mg)$_6$O$_{13}$ | 1690 | 273 | 0.49 | absent | ○ |
| S20 | as above | 2.56 | (K,Na,Li)$_2$(Ti, Nb, Mg)$_6$O$_{13}$ | 1620 | 238 | 0.48 | absent | ○ |
| S21 | as above | 3.41 | (K,Na,Li)$_2$(Ti, Nb, Mg)$_6$O$_{13}$ | 1460 | 178 | 0.43 | absent | ○ |
| S22 | as above | 4.70 | (K,Na,Li)$_2$(Ti, Nb, Mg)$_6$O$_{13}$ | 1380 | 157 | 0.43 | absent | ○ |
| S23 | as above | 5.60 | (K,Na,Li)$_2$(Ti, Nb, Mg)$_6$O$_{13}$ | 1110 | 112 | 0.31 | absent | ○ |

FIG.5
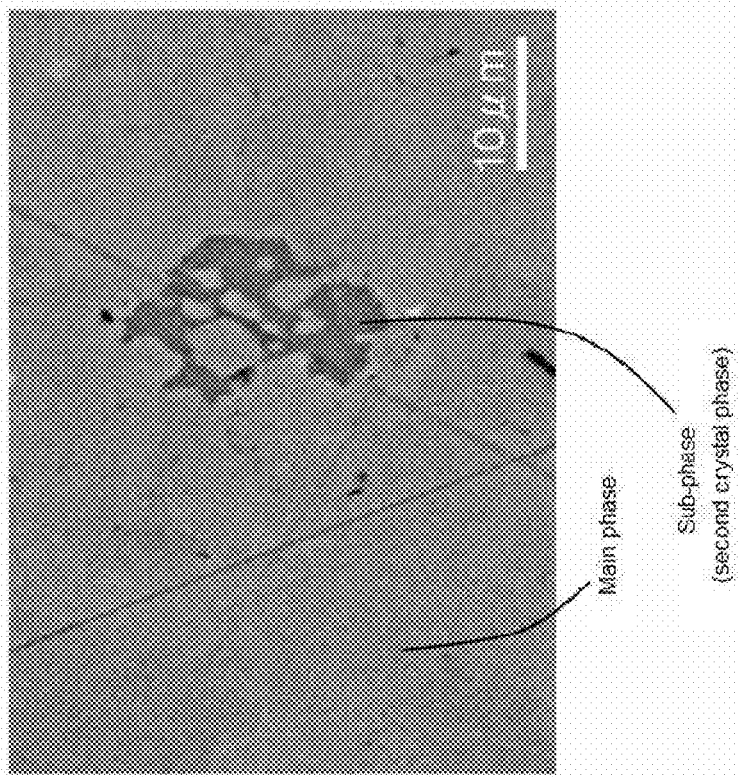
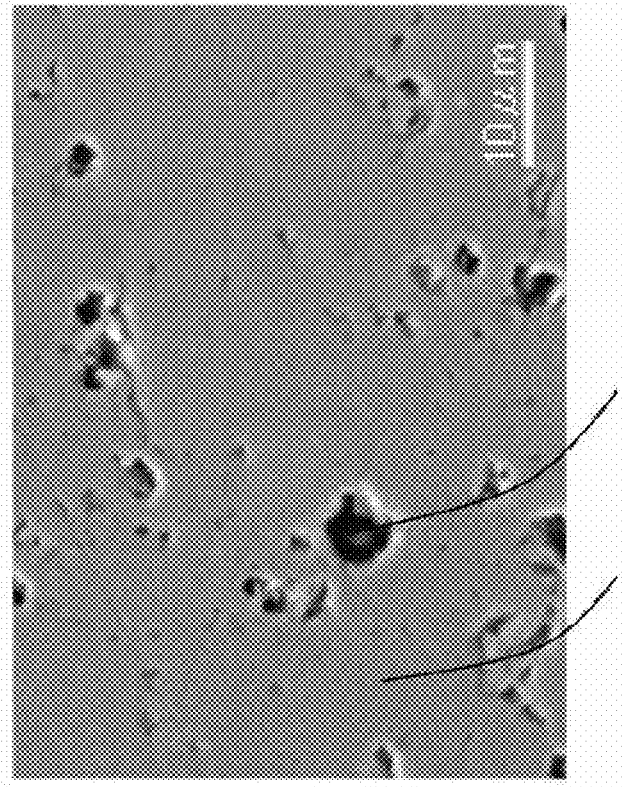

FIG.6A

Influence of coefficient e (No. 1)

(K$_a$Na$_b$Li$_c$C1$_{d1}$C2$_{d2}$)$_e$(D1$_{f1}$D2$_{f2}$D3$_{f3}$E1$_{g1}$E2$_{g2}$E3$_{g3}$)O$_n$

| Sample | First crystal phase (base phase) | | | | | | | | | | | | | | | | Second crystal phase (sub-phase) A$_2$B$_6$O$_{13}$ | | |
|---|---|---|---|---|---|---|---|---|---|---|---|---|---|---|---|---|---|---|---|
| | Element C | Element D | Element E | a | b | c | Coefficient d of element C | | e | Coefficient f of element D | | | Coefficient g of element E | | | Sub-phase ratio (vol%) | Element A | Element B |
| | | | | | | | d1 | d2 | | f1 | f2 | f3 | g1 | g2 | g3 | | | |
| S01(*) | — | Nb | — | 0.480 | 0.480 | 0.040 | 0 | 0 | 1.00 | 1.000 | 0 | 0 | 0 | 0 | 0 | 0 | — | — |
| S24 | Ca,Ba | Nb,Ti,Zr | Fe,Mg | 0.445 | 0.477 | 0.022 | 0.021 | 0.035 | 0.81 | 0.940 | 0.032 | 0.022 | 0.003 | 0.003 | 0.000 | 1.50 | K, Na, Li | Ti, Nb, Fe, Mg |
| S25 | Ca,Ba | Nb,Ti,Zr | Fe,Mg | 0.445 | 0.477 | 0.022 | 0.021 | 0.035 | 0.93 | 0.940 | 0.032 | 0.022 | 0.003 | 0.003 | 0.000 | 1.50 | K, Na, Li | Ti, Nb, Fe, Mg |
| S26 | Ca,Ba | Nb,Ti,Zr | Fe,Mg | 0.445 | 0.477 | 0.022 | 0.021 | 0.035 | 0.99 | 0.940 | 0.032 | 0.022 | 0.003 | 0.003 | 0.000 | 1.50 | K, Na, Li | Ti, Nb, Fe, Mg |
| S27 | Ca,Ba | Nb,Ti,Zr | Fe,Mg | 0.445 | 0.477 | 0.022 | 0.021 | 0.035 | 1.02 | 0.940 | 0.032 | 0.022 | 0.003 | 0.003 | 0.000 | 1.50 | K, Na, Li | Ti, Nb, Fe, Mg |
| S28 | Ca,Ba | Nb,Ti,Zr | Fe,Mg | 0.445 | 0.477 | 0.022 | 0.021 | 0.035 | 1.07 | 0.940 | 0.032 | 0.022 | 0.003 | 0.003 | 0.000 | 1.50 | K, Na, Li | Ti, Nb, Fe, Mg |
| S29 | Ca,Ba | Nb,Ti,Zr | Fe,Mg | 0.445 | 0.477 | 0.022 | 0.021 | 0.035 | 1.14 | 0.940 | 0.032 | 0.022 | 0.003 | 0.003 | 0.000 | 1.50 | K, Na, Li | Ti, Nb, Fe, Mg |
| S30 | Ca,Ba | Nb,Ti,Zr | Fe,Mg | 0.445 | 0.477 | 0.022 | 0.021 | 0.035 | 1.22 | 0.940 | 0.032 | 0.022 | 0.003 | 0.003 | 0.000 | 1.50 | K, Na, Li | Ti, Nb, Fe, Mg |
| S31 | Ca,Ba | Nb,Ti,Zr | Fe,Mg | 0.445 | 0.477 | 0.022 | 0.021 | 0.035 | 1.25 | 0.940 | 0.032 | 0.022 | 0.003 | 0.003 | 0.000 | 1.50 | K, Na, Li | Ti, Nb, Fe, Mg |

FIG. 6B

Influence of coefficient e (No. 2)

| Sample | First crystal phase (main phase) Composition | First crystal phase (main phase) e | Second crystal phase (sub-phase) Ratio (Vol%) | Second crystal phase (sub-phase) Composition $A_2B_6O_{13}$ | Relative dielectric constant $\varepsilon_{33}^T/\varepsilon_0$ | Dielectric loss tan δ | Piezo-electric constant $d_{33}$(pC/N) | Electro-mechanical coupling coefficient kr | Electro-mechanical coupling coefficient kt | Mechanical quality coefficient Qm | Curie point Tc °C |
|---|---|---|---|---|---|---|---|---|---|---|---|
| S01(*) | Fig. 6A | 1.00 | 0 | - | 430 | N/A | 110 | 0.32 | N/A | N/A | N/A |
| S24 | as above | 0.81 | 1.50 | (K,Na,Li)$_2$(Ti, Nb, Fe, Mg)$_6$O$_{13}$ | 1640 | 0.020 | 288 | 0.48 | 0.41 | 89 | 320 |
| S25 | as above | 0.93 | 1.50 | (K,Na,Li)$_2$(Ti, Nb, Fe, Mg)$_6$O$_{13}$ | 1660 | 0.020 | 290 | 0.49 | 0.41 | 80 | 320 |
| S26 | as above | 0.99 | 1.50 | (K,Na,Li)$_2$(Ti, Nb, Fe, Mg)$_6$O$_{13}$ | 1690 | 0.019 | 295 | 0.50 | 0.43 | 78 | 320 |
| S27 | as above | 1.02 | 1.50 | (K,Na,Li)$_2$(Ti, Nb, Fe, Mg)$_6$O$_{13}$ | 1750 | 0.018 | 305 | 0.51 | 0.44 | 70 | 315 |
| S28 | as above | 1.07 | 1.50 | (K,Na,Li)$_2$(Ti, Nb, Fe, Mg)$_6$O$_{13}$ | 1820 | 0.018 | 318 | 0.56 | 0.48 | 64 | 315 |
| S29 | as above | 1.14 | 1.50 | (K,Na,Li)$_2$(Ti, Nb, Fe, Mg)$_6$O$_{13}$ | 1700 | 0.020 | 307 | 0.54 | 0.43 | 65 | 315 |
| S30 | as above | 1.22 | 1.50 | (K,Na,Li)$_2$(Ti, Nb, Fe, Mg)$_6$O$_{13}$ | 1680 | 0.022 | 294 | 0.50 | 0.42 | 68 | 310 |
| S31 | as above | 1.25 | 1.50 | (K,Na,Li)$_2$(Ti, Nb, Fe, Mg)$_6$O$_{13}$ | 1630 | 0.022 | 290 | 0.49 | 0.40 | 70 | 300 |

N/A represents "no measurement"

FIG.7A

Influence of metal species of second crystal phase and third crystal phase (No. 1)

First crystal phase (base phase) and third crystal phase : $(K_aNa_bLi_cC1_dC2_{d2})(D1_{f1}D2_{f2}D3_{f3}E1_{g1}E2_{g2}E3_{g3})O_h$

| Sample | Element C | Element D | Element E | a | b | c | Coefficient d of element C | | e | Coefficient f of element D | | | Coefficient g of element E | | | Second crystal phase (sub-phase) : $A_2B_8O_{13}$ | | |
|---|---|---|---|---|---|---|---|---|---|---|---|---|---|---|---|---|---|---|
| | | | | | | | d1 | d2 | | f1 | f2 | f3 | g1 | g2 | g3 | Sub-phase ratio (Vol%) | Element A | Element B |
| S18 | Ca, Ba | Nb, Ti, Zr | Mg | 0.445 | 0.477 | 0.022 | 0.021 | 0.035 | 1.04 | 0.949 | 0.021 | 0.025 | 0.005 | 0 | 0 | 1.45 | K, Na, Li | Ti, Nb, Mg |
| S07 | Ca, Ba | Nb, Ti, Zr | Fe, Mg | 0.445 | 0.477 | 0.022 | 0.021 | 0.035 | 1.04 | 0.944 | 0.021 | 0.025 | 0.005 | 0.005 | 0 | 1.42 | K, Na, Li | Ti, Nb, Fe, Mg |
| S31 | Ca, Ba | Nb, Ti, Zr | Ca, Mg | 0.455 | 0.483 | 0.022 | 0.020 | 0.020 | 1.07 | 0.945 | 0.020 | 0.025 | 0.005 | 0.005 | 0 | 1.40 | K, Na, Li | Ti, Nb, Ca, Mg |
| S32 | Ca, Ba | Nb, Ti, Zr | Zn, Mg | 0.455 | 0.483 | 0.022 | 0.020 | 0.020 | 1.07 | 0.945 | 0.020 | 0.025 | 0.005 | 0.005 | 0 | 1.40 | K, Na, Li | Ti, Nb, Zn, Mg |
| S33 | Ca, Ba | Nb, Ti, Zr | Mn, Mg | 0.455 | 0.483 | 0.022 | 0.020 | 0.020 | 1.07 | 0.945 | 0.020 | 0.025 | 0.005 | 0.005 | 0 | 1.40 | K, Na, Li | Ti, Nb, Mn, Mg |
| S34 | Ca, Ba | Nb, Ti, Zr | Al, Mg | 0.455 | 0.483 | 0.022 | 0.020 | 0.020 | 1.07 | 0.945 | 0.020 | 0.025 | 0.005 | 0.005 | 0 | 1.40 | K, Na, Li | Ti, Nb, Al, Mg |
| S35 | Ca, Ba | Nb, Ti, Zr | Ni, Mg | 0.455 | 0.483 | 0.022 | 0.020 | 0.020 | 1.07 | 0.945 | 0.020 | 0.025 | 0.005 | 0.005 | 0 | 1.40 | K, Na, Li | Ti, Nb, Ni, Mg |
| S36 | Ca, Ba | Nb, Ti, Zr | Fe, Zn, Mg | 0.455 | 0.483 | 0.022 | 0.020 | 0.020 | 1.07 | 0.940 | 0.020 | 0.025 | 0.005 | 0.005 | 0.005 | 1.40 | K, Na, Li | Ti, Nb, Fe, Zn, Mg |
| S37 | Ca, Ba | Nb, Ti, Zr | Fe, Zn, Mg | 0.455 | 0.483 | 0.022 | 0.020 | 0.020 | 1.07 | 0.940 | 0.020 | 0.025 | 0.005 | 0.005 | 0.005 | 4.50 | K, Na, Li | Ti, Nb, Fe, Zn, Mg |
| S38 | Ca, Ba | Nb, Ti, Zr | Fe, Mg | 0.455 | 0.483 | 0.022 | 0.020 | 0.020 | 1.07 | 0.945 | 0.020 | 0.025 | 0.005 | 0.005 | 0 | 4.50 | K, Na, Li | Ti, Nb, Fe, Mg |

FIG. 7B

Influence of metal species of second crystal phase and third crystal phase (No. 2)

| Sample | First crystal phase (main phase) Composition | Second crystal phase (sub-phase) A₄B₆O₁₃ Ratio (Vol%) | Second crystal phase (sub-phase) A₄B₆O₁₃ Composition | Third crystal phase (sub-phase) present/absent | Third crystal phase (sub-phase) Ratio (Vol%) | Third crystal phase (sub-phase) Composition | Relative dielectric constant $\varepsilon_{33}/\varepsilon_0$ | Dielectric loss tan δ | Piezo-electric constant $d_{33}$(pC/N) | Electro-mechanical coupling coefficient kr | Electro-mechanical coupling coefficient kt | Mechanical quality coefficient Qm | Curie point Tc °C |
|---|---|---|---|---|---|---|---|---|---|---|---|---|---|
| S18 | Fig. 7A | 1.45 | (K,Na,Li)₂(Ti, Nb, Mg)₆O₁₃ | absent | - | - | 1720 | N/A | 284 | 0.50 | N/A | N/A | N/A |
| S07 | as above | 1.42 | (K,Na,Li)₂(Ti, Nb, Fe, Mg)₆O₁₃ | absent | - | - | 1820 | N/A | 312 | 0.54 | N/A | N/A | N/A |
| S31 | as above | 1.40 | (K,Na,Li)₂(Ti, Nb, Co, Mg)₆O₁₃ | absent | | | 1790 | 0.022 | 318 | 0.54 | 0.44 | 55 | 315 |
| S32 | as above | 1.40 | (K,Na,Li)₂(Ti, Nb, Zn, Mg)₆O₁₃ | absent | | | 1830 | 0.025 | 320 | 0.54 | 0.45 | 53 | 315 |
| S33 | as above | 1.40 | (K,Na,Li)₂(Ti, Nb, Mn, Mg)₆O₁₃ | absent | | | 1450 | 0.017 | 285 | 0.51 | 0.44 | 145 | 320 |
| S34 | as above | 1.40 | (K,Na,Li)₂(Ti, Nb, Al, Mg)₆O₁₃ | absent | | | 1670 | 0.021 | 289 | 0.50 | 0.45 | 67 | 315 |
| S35 | as above | 1.40 | (K,Na,Li)₂(Ti, Nb, Ni, Mg)₆O₁₃ | absent | | | 1680 | 0.025 | 300 | 0.52 | 0.46 | 60 | 320 |
| S36 | as above | 1.40 | (K,Na,Li)₂(Ti, Nb, Fe, Zn, Mg)₆O₁₃ | absent | | | 1920 | 0.022 | 309 | 0.53 | 0.46 | 53 | 325 |
| S37 | as above | 4.50 | (K,Na,Li)₂(Ti, Nb, Fe, Zn, Mg)₆O₁₃ | present | 0.2 or less | K(Zn,Ti)O₂ | 1710 | 0.022 | 290 | 0.51 | 0.43 | 55 | 305 |
| S38 | as above | 4.50 | (K,Na,Li)₂(Ti, Nb, Fe, Mg)₆O₁₃ | present | 0.2 or less | (Ba,Na,K)₆(Nb,Fe)₁₀O₁₅ | 1890 | 0.026 | 280 | 0.50 | 0.43 | 50 | 305 |

N/A represents "no measurement"

FIG.8

Results of thermal cycle test

| Sample | Piezo-electric characteristics $d_{33}$ (pC/N) | | |
|---|---|---|---|
| | Initial value | After thermal cycles | Decrease rate (%) |
| S01(*) | 110 | 73 | -34.0 |
| S06 | 321 | 303 | -5.6 |
| S17 | 298 | 278 | -6.7 |
| S36 | 309 | 290 | -6.1 |

LEAD-FREE PIEZO-ELECTRIC PORCELAIN COMPOSITION, PIEZO-ELECTRIC ELEMENT USING THE SAME, AND METHOD FOR PRODUCING LEAD-FREE PIEZO-ELECTRIC PORCELAIN COMPOSITION

CROSS REFERENCE TO RELATED APPLICATION

This application is based upon and claims the benefit of priority of Japanese Patent Application No. 2014-081770 filed on Apr. 11, 2014, the contents of which are incorporated herein by reference in its entirety.

BACKGROUND OF THE INVENTION

1. Field of the Invention

The present invention relates to a lead-free piezo-electric porcelain composition for use as a piezo-electric device or the like, a piezo-electric device using the same, and a method for producing the same.

2. Description of the Related Art

Many of hitherto mass-produced piezo-electric porcelains (piezo-electric ceramics) have been composed of a PZT-based (lead titanate zirconate-based) material, and contain lead. However, in recent years, in order to eliminate the adverse influence of lead on the environment, there has been a desire to develop a lead-free piezo-electric porcelain. As a material of such a lead-free piezo-electric porcelain (referred to as a "lead-free piezo-electric porcelain composition"), the use of a perovskite oxide containing K, Na and Nb (or tantalum) as main metal components (hereinafter referred to as a "KNN phase") has been proposed. However, the KNN phase itself has a problem in that it is inferior in sinterability and humidity resistance.

In addressing such problems, JP-A-2001-190146 (Patent Document 1) proposes to improve piezo-electric characteristics by allowing glass to exist at the grain boundary of crystal grains of a compound represented by the general formula $K_xNa_{(1-x)}NbO_3$.

Moreover, Japanese Patent No. 5214373 (Patent Document 2) proposes to improve piezo-electric characteristics and the like by using $[K_{1-x}Na_x]_{1-y}Li_y[Nb_{1-z-w}Ta_zSb_w]O_3$ as a main phase and incorporating $K_3Nb_3O_6Si_2O_7$ as a sub-phase to micronize the main phase.

WO 2013/008418 (Patent Document 3) of the present applicant discloses improving piezo-electric characteristics and the like by using the KNN phase as a first crystal phase (main phase), incorporating an NTK phase containing Nb, Ti and K as main metal components of a second crystal phase (sub-phase), and filling the spaces between the crystal particles of the first crystal phase with the second crystal phase.

However, since the crystal structure of the KNN phase is nearly cubic, a large number of voids are inevitably generated with grain growth. In Patent Document 1, the grain boundary of the KIND phase can be filled with glass, but there is a problem in that the piezo-electric characteristics cannot be sufficiently improved by filling the grain boundary. Moreover, even in Patent Document 2, the main phase can be micronized by incorporating $K_3Nb_3O_6Si_2O_7$ as a sub-phase. However, since a large number of voids remain, there is also a problem in that the piezo-electric characteristics cannot be sufficiently improved. In Patent Document 3, the piezo-electric characteristics and the like are improved by filling the spaces between the crystal particles of the first crystal phase with the NTK phase. However, the piezo-electric constant $d_{33}$ is at most about 250 pC/N, and there is a problem in that sufficient characteristics are not necessarily obtained. Accordingly, in order to place various devices using a lead-free piezo-electric porcelain composition into practical use, there has been a desire to develop a lead-free piezo-electric porcelain composition having enhanced piezo-electric characteristics.

SUMMARY OF THE INVENTION

The present invention has been made to solve the foregoing problems, and can be embodied as follows.

(1) According to a first aspect, the present invention provides a lead-free piezo-electric porcelain composition. The lead-free piezo-electric porcelain composition comprises: a main phase having voids and which is formed of a first crystal phase composed of an alkali niobate/tantalate-based perovskite oxide having piezo-electric characteristics; and a sub-phase containing a second crystal phase composed of an $A_2B_6O_{13}$-based compound (wherein the element A is a monovalent element and the element B is one or more divalent to hexavalent elements), wherein the sub-phase fills the voids present in the main phase.

According to the lead-free piezo-electric porcelain composition (1), since the sub-phase containing the second crystal phase composed of the $A_2B_6O_{13}$-based compound fills the voids of the main phase to thereby stabilize the structure of the main phase, it is possible to provide a lead-free piezo-electric porcelain composition having excellent piezo-electric characteristics.

(2) In a preferred embodiment of the lead-free piezo-electric porcelain composition (1) above, the element A includes at least one metal element selected from Li, Na and K and the element B includes at least one metal element selected from Co, Fe, Mg, Ni, Zr, Zn, Mn Al, Nb, Ta, W and Ti.

According to the above configuration (2), a compound having a stable structure can be obtained as the second crystal phase. As a result, a lead-free piezo-electric porcelain composition having excellent piezo-electric characteristics can be provided.

(3) In another preferred embodiment of the above lead-free piezo-electric porcelain composition (1) or (2) above, the element B includes at least Mg.

When Mg is contained as the element B, it is possible to provide a lead-free piezo-electric porcelain composition having excellent piezo-electric characteristics and also excellent insulation characteristics.

(4) In yet another preferred embodiment of the lead-free piezo-electric porcelain composition of any of (1) to (3) above, the $A_2B_6O_{13}$-based compound has a layered structure.

Since the second crystal phase having a layered structure has a high action of filling the voids of the main phase to stabilize the structure of the main phase, the piezo-electric characteristics can be improved.

(5) In yet another preferred embodiment of the lead-free piezo-electric porcelain composition of any of (1) to (4) above, the content ratio of the second crystal phase in the lead-free piezo-electric porcelain composition is any of the following: (i) 0.30% by volume or more and 3.10% by volume or less, (ii) 0.50% by volume or more and 2.50% by volume or less, and (iii) 1.00% by volume or more and 2.00% by volume or less.

According to the above configuration, the piezo-electric characteristics of the lead-free piezo-electric porcelain composition can be further improved.

(6) In yet another preferred embodiment of the lead-free piezo-electric porcelain composition of any of (1) to (5) above, the volume ratio of the second crystal phase is larger than 50% when the whole of the sub-phase is taken as 100%.

According to the above configuration, since the effect of stabilizing the structure of the first crystal phase by the second crystal phase becomes remarkable, the characteristics of the lead-free piezo-electric porcelain composition can be further improved.

(7) In yet another preferred embodiment of the lead-free piezo-electric porcelain composition of any of (1) to (6) above, the alkali niobate/tantalate-based perovskite oxide that forms the first crystal phase contains an alkaline earth metal.

According to the above configuration, a lead-free piezo-electric porcelain composition having excellent piezo-electric characteristics can be obtained.

(8) In yet another preferred embodiment of the lead-free piezo-electric porcelain composition of any of (1) to (7) above, the alkali niobate/tantalate-based perovskite oxide forming the first crystal phase is represented by a compositional formula $(K_aNa_bLi_cC_d)_e(D_fE_g)O_h$ (where the element C is one or more selected from Ca, Sr, Ba and Rb, the element D is one or more, including at least Nb or Ta, selected from Nb, Ta, Ti and Zr, the element E is one or more selected from Mg, Al, Sc Mn, Fe, Co, Ni, Zn, Ga and Y, a+b±c±d=1, e is any value, f+g=1, and h is any value that forms a perovskite).

According to the above configuration, the characteristics of the lead-free piezo-electric porcelain composition can be improved.

(9) In a preferred embodiment of the lead-free piezo-electric porcelain composition (8) above, the coefficient e satisfies $0.80 \leq e \leq 1.30$.

According to the above configuration, the characteristics of the lead-free piezo-electric porcelain composition can be further improved.

(10) According to second aspect, the present invention provides a piezo-electric device comprising a piezo-electric porcelain formed of the above lead-free piezo-electric porcelain composition of any of (1) to (9) above, and an electrode attached to the piezo-electric porcelain.

(11) According to yet a third aspect, the present invention provides a method for producing the lead-free piezo-electric porcelain composition of any of (1) to (9) above. The method comprises a step of mixing and calcining raw materials of the first crystal phase to form a first powder, a step of mixing and calcining raw materials of the second crystal phase to form a second powder, and a step of forming the lead-free piezo-electric porcelain composition by mixing the first powder and the second powder, molding to form a green body, and firing, wherein the firing is closed firing performed while the green body is enclosed in a closed vessel.

According to the above method, a lead-free piezo-electric porcelain composition can be formed having excellent piezo-electric characteristics, which comprises a first crystal phase composed of an alkali niobate/tantalate-based perovskite oxide having piezo-electric characteristics and a second crystal phase composed of an $A_2B_6O_{13}$-based compound.

The invention can be realized in various modes, such as a lead-free piezo-electric porcelain composition, a piezo-electric element using the same, various devices comprising the piezo-electric element (knock sensors, ultrasonic vibrators, cutting tools, ultrasonic sensors, actuators, etc.) and a method for producing the lead-free piezo-electric porcelain composition.

BRIEF DESCRIPTION OF THE DRAWINGS

FIG. 3A is a figure including experimental results which show the influence of the sub-phase ratio on piezo-electric characteristics.

FIG. 3B is a figure including experimental results which show the influence of the sub-phase ratio on piezo-electric characteristics.

FIG. 5 is a figure showing reflected electron images of certain samples described in the Examples.

FIG. 6A is a figure including experimental results which show the influence of the coefficient e of the main phase.

FIG. 6B is a figure including experimental results which show the influence of the coefficient e of the main phase.

FIG. 7A is a figure including experimental results which show the influence of metal species of the second crystal phase and the presence of the third crystal phase.

FIG. 7B is a figure including experimental results which show the influence of the presence of the third crystal phase.

FIG. 8 is a figure showing the results of thermal cycle testing.

DETAILED DESCRIPTION OF THE PREFERRED EMBODIMENTS

Figure 1:
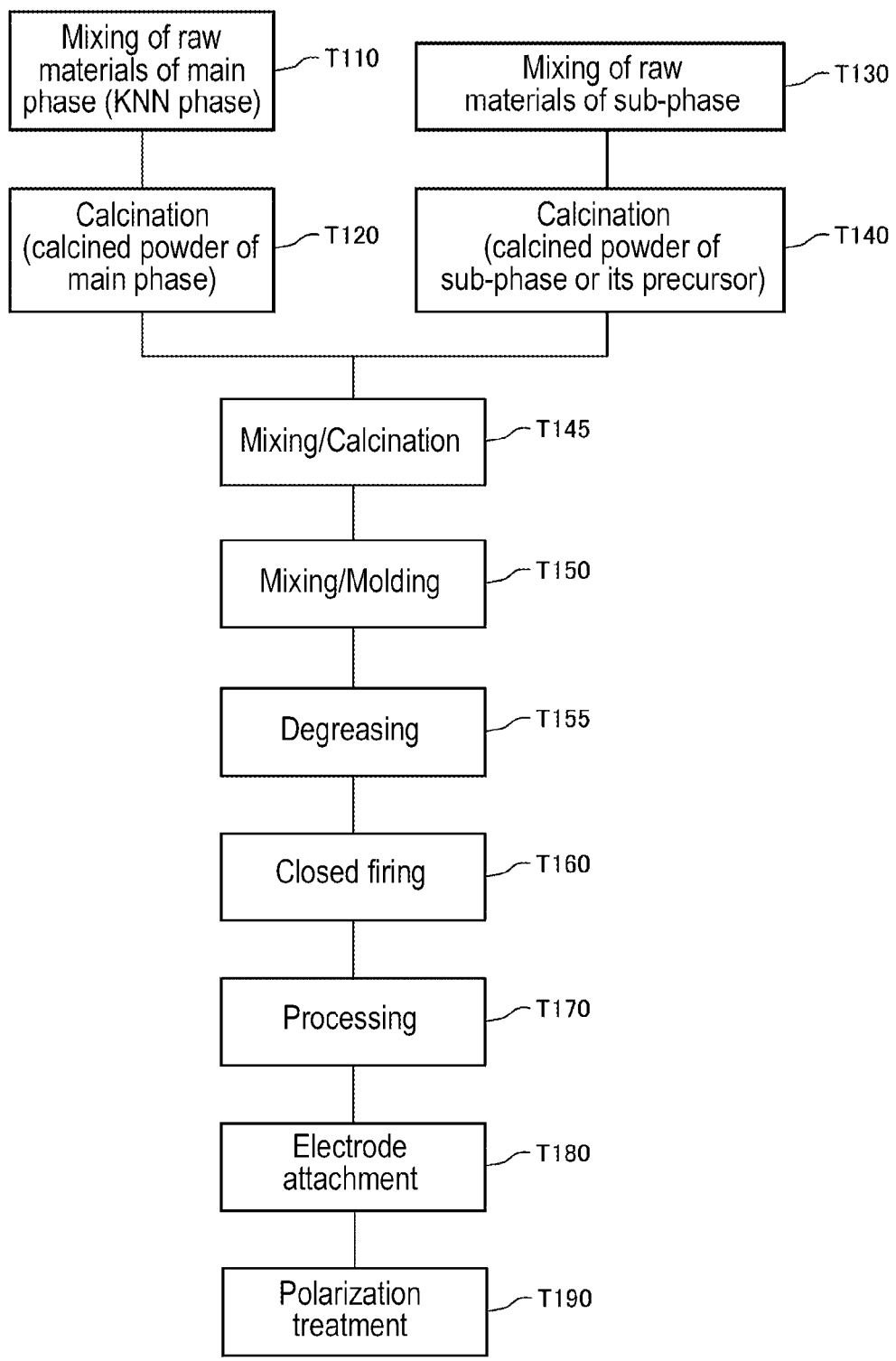
FIG. 1 is a flow chart showing a method for producing a piezo-electric element in one embodiment of the invention.

The invention is next described in detail with reference to the drawings. However, the present invention should not be construed as being limited thereto.

The piezo-electric porcelain composition as one embodiment of the invention is a lead-free piezo-electric porcelain composition comprising a main phase formed of a first crystal phase composed of an alkali niobate/tantalate-based perovskite oxide having piezo-electric characteristics and a sub-phase containing a second crystal phase composed of an $A_2B_6O_{13}$-based compound. Hereinafter, the first crystal phase is also referred to as "main phase" and the crystal phase other than the main phase is referred to as "sub-phase". Preferable compositions of the main phase and the sub-phase will be described below. The sub-phase stabilizes the structure of the main phase and improves the piezo-electric characteristics by mixing with the main phase. Specifically, the sub-phase has a function of stabilizing the structure of the main phase by filling the voids of the main phase. The sub-phase may include crystal phases (a third crystal phase and the like) other than the second crystal phase.

<Composition of the Main Phase>

The perovskite oxide that forms the main phase preferably includes at least one of an alkali niobate-based perovskite oxide and an alkali tantalate-based perovskite oxide. The term "alkali niobate/tantalite-based perovskite oxide" is a generic name encompassing a plurality of perovskite oxides. The alkaline component of the alkali niobate/tantalite-based perovskite oxide contains at least alkali metal(s) (K (potassium), Na (sodium), Li (lithium), Rb (rubidium), etc.) and may contain alkaline earth metal(s) (Ca (calcium), Sr (strontium), Ba (barium), etc.). Among alkali niobate/tantalite-based perovskite oxides, those represented by the following compositional formula are preferred:

$$(K_a Na_b Li_c Ca_d)_e (D_f E_g) O_h \quad (1)$$

wherein the element C is one or more selected from Ca (calcium), Sr (strontium), Ba (barium) and Rb (rubidium), the element D is one or more, including at least Nb or Ta, selected from Nb (niobium), Ta (tantalum), Ti (titanium) and Zr (zirconium), the element E is one or more selected from Mg (magnesium), Al (aluminum), Sc (scandium), Mn (manganese), Fe (iron), Co (cobalt), Ni (nickel), Zn (zinc), Ga (gallium) and Y (yttrium), $a+b+c+d=1$, e is any value, $f+g=1$, and h is any value that forms a perovskite.

In the above compositional formula (1), in the case where the elements C and E may each include one or two elements and also the element D may include one to three elements, the formula can be re-written as the following compositional formula (1a):

$$(K_a Na_b Li_c C1_{d1} C2_{d2})_e (D1_{f1} D2_{f2} D3_{f3} E1_{g1} E2_{g2}) O_h \quad (1a)$$

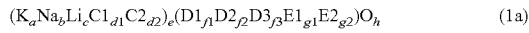

wherein $a+b+c+d1+d2=1$, e is any value, $f1+f2+f3+g1+g2=1$, and h is any value that forms a perovskite. The compositional formula (1a) is equivalent to the above compositional formula (1). As understood from this example, in the case where the element C includes two metal elements, the value of coefficient d of the element C is represented by the sum of coefficients d1 and d2 of the two elements C1 and C2. The same applies to the elements D and E.

In the above compositional formula (1), K (potassium), Na (sodium), Li (lithium) and the element C (Ca, Sr, Ba, Rb) are arranged at the so-called A site of the perovskite structure. Moreover, the element D (one or more, including at least Nb or Ta, selected from Nb, Ta, Ti and Zr) and the element E (one or more selected from Mg, Al, Sc, Mn, Fe, Co, Ni, Zn, Ga and Y) are arranged at the so-called B site. Of the coefficients a, b, c, and d of the elements at the A site, the sum of the first three coefficients (a+b+c) is preferably not zero but the coefficient d may be zero. Also, of the coefficients f and g of the elements D and E at the B site, the coefficient f of the element D is preferably not zero but the coefficient g of the element E may be zero. Namely, the alkali niobate/tantalite-based perovskite oxide of the present embodiment is preferably a perovskite oxide which contains at least one alkali metal (K, Na, Li and/or Rb) and may also contain alkaline earth metal(s) (Ca, Sr and/or Ba) at the A site and contains one or more, including at least Nb or Ta, selected from Nb, Ta, Ti, and Zr and also may contain one or more selected from the other metals (Mg, Al, Sc, Mn, Fe, Co, Ni, Zn, Ga and Y) at the B site. Furthermore, the B site most preferably includes Nb as a constituent element. The alkali niobate-based perovskite oxide containing Nb is preferable as compared with an alkali tantalite-based perovskite oxide containing no Nb by providing a lead-free piezo-electric porcelain composition having high a Curie temperature (Tc). This point may be ascertained by analogy from the results of FIG. 6 in WO 2011/093021 disclosed by the present applicant.

As the values of the coefficients a, b, c, d, e, f, g and h in the above compositional formula (1), among the combinations of the values establishing the perovskite structure, preferable values can be selected from the viewpoint of electric characteristics or piezo-electric characteristics (especially piezo-electric constant $d_{33}$) of the lead-free piezo-electric porcelain composition. Specifically, the coefficients a, b and c are each preferably a value of 0 or more and less than 1 but $a=b=c=0$ (i.e., a piezo-electric porcelain composition that does not contain any of K, Na and Li) is not satisfied. The coefficients a and b of K and Na are typically $0<a\leq0.6$ and $0<b\leq0.6$. The coefficient c of Li may be zero but is preferably $0<c\leq0.2$, and further preferably $0<c\leq0.1$. The coefficient d of the element C (one or more of Ca, Sr, and Ba) may be zero but is preferably $0<d\leq0.2$, and further preferably $0<d\leq0.1$. The coefficient e for the whole A site is any value but is preferably $0.80\leq e\leq1.30$, further preferably $0.80\leq e\leq1.25$, and most preferably $1.00\leq e\leq1.15$. The coefficient h of oxygen may have any value as long as the main phase forms a perovskite oxide. A typical value of the coefficient h is about 3 and is preferably $2.9\leq h\leq3.1$. The value of the coefficient h can be calculated from electrically neutral conditions of the composition of the main phase. However, as the composition of the main phase, even a composition that slightly deviates from electrically neutral conditions is allowable.

A typical composition of the main phase is $(K,Na,Li,Ca,Ba)_e(Nb,Ti,Zr)O_h$, which contains K, Na and Nb as main metal components. Since the main phase contains K, Na, and Nb as main metal components, the material composing the main phase is also referred to "KNN" or "KNN material" and the main phase is also referred to as "KNN phase". When the main phase is formed of the KNN phase, it is possible to provide a lead-free piezo-electric porcelain composition having excellent piezo-electric characteristics.

<Composition of the Second Crystal Phase>

In the $A_2B_6O_{13}$-based compound that forms the second crystal phase, the element A is a monovalent element and the element B is one or more divalent to hexavalent elements. The element A preferably includes at least one selected from Li (lithium), Na (sodium) and K (potassium). Furthermore, the element B preferably includes at least one selected from Co (cobalt), Fe (iron), Mg (magnesium), Ni (nickel), Zr (zirconium), Zn (zinc), Mn (manganese), Al (aluminum), Nb (niobium), Ta (tantalum), W (tungsten) and Ti (titanium). Moreover, the element B further preferably includes at least Mg from the viewpoint of increasing insulation characteristics.

The sub-phase containing the $A_2B_6O_{13}$-based compound does not have piezo-electric characteristics of itself and has a function of improving sinterability and density by mixing it with the main phase. Moreover, when the sub-phase is added, it is possible to obtain a lead-free piezo-electric porcelain composition having excellent piezo-electric characteristics (especially piezo-electric constant $d_{33}$ and electromechanical coupling coefficient kr). The $A_2B_6O_{13}$-based compound is particularly preferably one having a layered structure. The $A_2B_6O_{13}$-based compound having a layered structure has a remarkable effect of improving the characteristics of the piezo-electric porcelain composition by filling a large number of voids generated in the main phase to stabilize the structure of the main phase.

The sub-phase of the piezo-electric porcelain composition may contain crystal phase(s) (third crystal phase and the like) other than the second crystal phase. As the third crystal phase, for example, it is preferable to utilize the crystal phase of an $A_3B_5O_{15}$-based compound (where the element A is a monovalent or divalent metal and the element B is a divalent to pentavalent metal). As the $A_3B_5O_{15}$-based compound, a compound can be utilized wherein the element A (monovalent or divalent metal) is at least one selected from Ba, Ca, Na, K and Li and the element B (divalent to pentavalent metal) is at least one selected from Nb, Ta, Ti, Mn, Fe, Ni, Co, Zn and Zr. Specifically, for example, it is possible to utilize $(Ba,Na,K)_3(Nb,Fe)_5O_{15}$, $(Ba,Na,K)_3(Nb,Ni,Fe)_5O_{15}$, $(Ba,Na,K)_3(Nb,Co,Ni)_5O_{15}$, $(Ba,Na,K)_3(Nb,Zn)_5O_{15}$, $(Ba,Na,K)_3(Nb,Mn)_5O_{15}$, $(Ba,Na,K)_3(Nb,Fe,Zn,Co)_5O_{15}$ and the like. When a third crystal phase is present, there is a possibility of increasing the stability of the whole piezo-electric porcelain composition. The sub-phase may contain a metal oxide different from the $A_3B_5O_{15}$-based compound as the third crystal phase (or fourth crystal phase). Also, in the case where the sub-phase contains a crystal phase other than the second crystal phase, the volume ratio of the second crystal phase is preferably larger than 50%, more preferably 70% or more, and further preferably 80% or more when the whole of the sub-phase is taken as 100%. The reason is that the effect of the second crystal phase on the stabilization of the structure of the first crystal phase becomes insufficient when the ratio of the second crystal phase considerably decreases.

FIG. 1 is a flow chart showing a method for producing a piezo-electric element in an embodiment of the invention. In the process T110, as raw materials of the main phase (KNN phase), necessary ones are selected from raw materials of $K_2CO_3$ powder, $Na_2CO_3$ powder, $Li_2CO_3$ powder, $CaCO_3$ powder, $SrCO_3$ powder, $BaCO_3$ powder, $Nb_2O_5$ powder, $Ta_2O_5$ powder, $TiO_2$ powder, $ZrO_2$ powder, $MgO$ powder, $Al_2O_3$ powder, $Sc_2O_3$ powder, $MnO_2$ powder, $Fe_2O_3$ powder, $Co_3O_4$ powder, $NiO$ powder, $ZnO$ powder, $Ga_2O_3$ powder, $Y_2O_3$ powder, and the like and are weighed according to the values of the coefficients a, b, c, d, e, f and g in the compositional formula of the main phase. Then, ethanol is added to these raw material powders, and the whole is wet mixed in a ball mill preferably for 15 hours or more to obtain a slurry. In the process T120, a mixed powder obtained by drying the slurry is calcined, for example, under an air atmosphere at 600° C. to 1,100° C. for 1 to 10 hours to form a main-phase calcined powder.

In the process T130, as raw materials of the sub-phase (second crystal phase), in addition to $TiO_2$ powder, essential ones are selected from $Li_2CO_3$ powder, $Na_2CO_3$ powder, $K_2CO_3$ powder, $Co_3O_4$ powder, $Fe_2O_3$ powder, $MgO$ powder, $NiO$ powder, $ZrO_2$ powder, $MnO_2$ powder, $Al_2O_3$ powder, $Nb_2O_5$ powder, $Ta_2O_5$ powder, $WO_3$ powder, and the like and they are weighed according to the compositional formula of the second crystal phase. In the case of producing a piezo-electric porcelain composition having a sub-phase containing the third crystal phase (e.g., the $A_3B_5O_{15}$-based compound), in the process T130 or the process T145 described below, metal oxide powders to be raw materials of the third crystal phase may be appropriately mixed. Then, ethanol is added to these raw material powders and the whole is wet mixed in a ball mill preferably for 15 hours or more to obtain a slurry. In the process T140, a mixed powder obtained by drying the slurry is calcined, for example, under an air atmosphere at 600° C. to 1,100° C. for 1 to 10 hours to form a sub-phase calcined powder. The sub-phase calcined powder is a powder containing an $A_2B_6O_{13}$-based compound or a powder containing a precursor of the $A_2B_6O_{13}$-based compound. The precursor of the $A_2B_6O_{13}$-based compound is a substance that is not yet the $A_2B_6O_{13}$-based compound after completing calcination in the process T140 but will be converted into the $A_2B_6O_{13}$-based compound by firing in the process T160 described below.

In the process T145, the main-phase calcined powder and the sub-phase calcined powder are separately weighed and they are pulverized and mixed in a ball mill after adding a dispersant, a binder and ethanol to form a slurry. Furthermore, a mixed powder obtained by drying the slurry is calcined, for example, under an air atmosphere at 600° C. to 1,100° C. for 1 to 10 hours to form a calcined powder. As described below, in the present embodiment, a preferable ratio of the sub-phase in the piezo-electric porcelain composition is defined as % by volume. On the other hand, the mixing ratio of the main-phase calcined powder to the sub-phase calcined powder in the process T145 is defined using the weight of the main-phase calcined powder and the weight of the sub-phase calcined powder. On this occasion, it is possible to empirically determine the relationship between the sub-phase ratio (% by weight) at the mixing in the process T145 and the sub-phase ratio (% by volume) in the piezo-electric porcelain composition beforehand.

In the process T150, a dispersant, a binder and ethanol are again added to the calcined powder obtained in the process T145 and the whole is pulverized and mixed to form a slurry. The slurry is dried in a spray-dry drier, granulated, and, for example, subjected to uniaxial pressing under a pressure of 20 MPa to be molded into a desired shape. The shapes of typical piezo-electric porcelains suitable for various devices as embodiments of the invention are a disk shape, a cylindrical shape, a rectangular plate shape, and the like. Thereafter, a CIP treatment (cold isostatic pressing treatment) is performed, for example, under a pressure of 150 MPa to obtain a green body. In the process T155, the obtained green body is held, for example, under an air atmosphere at 500° C. to 800° C. for 2 to 10 hours to perform a binder removal process in which the binder is pyrolized. In the process T160, the green body after the binder removal process is fired by holding it, for example, under an air atmosphere at a specific temperature (e.g., 1,150° C.) selected from 1,000° C. to 1,300° C. for 2 to 50 hours to obtain a piezo-electric porcelain. The firing at the process T160 is preferably closed firing performed in a state in which the green body is enclosed in a closed vessel. The reason for the closed firing is that metal elements such as alkali metals (Li, Na, and K) contained in the green body are prevented from dissipating to the outside during firing. As the closed vessel, for example, "Alumina Saya A-1174" manufactured by OTAKE CERAM K.K., may be used. In the process T170, the piezo-electric porcelain is processed according to a dimensional accuracy required for the piezo-electric element. In the process T180, electrodes are attached to the thus obtained piezo-electric porcelain and a polarization treatment is performed in the process T190.

The aforementioned production method is exemplary, and it is possible to utilize other various processes and treating conditions for producing the piezo-electric element. For example, instead of separately forming the main phase and the sub-phase beforehand and subsequently mixing and firing both powders as in FIG. 1, the raw materials may be mixed and fired (as a single batch) in the amount ratios according to the composition of the final piezo-electric porcelain composition to thereby produce the piezo-electric porcelain composition. However, according to the production method of FIG. 1, since the compositions of the main phase and the sub-phase are more accurately and easily controlled, it is possible to increase the yield of the piezo-electric porcelain composition.

Figure 2:
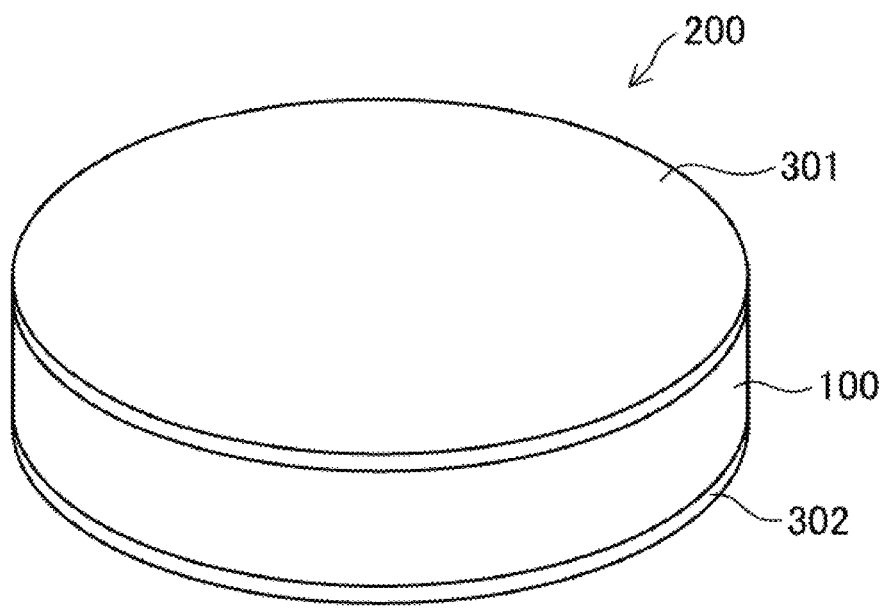
FIG. 2 is a perspective view showing a piezo-electric element as one embodiment of the invention.

FIG. 2 is a perspective view showing a piezo-electric element as an embodiment of the invention. The piezo-electric element 200 has a configuration where electrodes 301 and 302 are attached to the upper surface and the lower surface of a disk-shaped piezo-electric porcelain 100. Further, the piezo-electric element can assume various shapes and configurations other than the above.

The piezo-electric porcelain compositions and the piezo-electric elements according to the embodiments of the invention can be widely used in vibration detection applications, pressure detection applications, oscillation applications, piezo-electric device applications, and the like. For example, they can be utilized for various devices including piezo-electric devices such as various sensors for detecting vibration (knock sensors, combustion pressure sensors, etc.), vibrators, actuators, and filters, high-voltage generating devices, micro power sources, various drive devices, position control devices, vibration suppressing devices, fluid ejecting devices (coating ejection, fuel ejection, etc.), and the like. In addition, the piezo-electric porcelain compositions and the piezo-electric elements according to the embodiments of the invention are particularly suitable for applications where excellent thermal durability is required (e.g., knock sensors, combustion pressure sensors, etc.).

EXAMPLES

FIGS. 3A and 3B include experimental results which show the influence of the sub phase ratio on piezo-electric characteristics for a plurality of sample compositions including the Examples of the present invention. In FIGS. 3A and 3B, for the sample S01 of the Comparative Example and samples S02 to S23 of the Examples, the components of the main phase and the components of the sub-phase at the time of material mixing are shown and also the sub-phase ratio (% by volume) in the piezo-electric porcelain composition after firing is shown. The elements C to E and the coefficients a to g of the main phase are for the above formula (1a). Incidentally, in FIGS. 3A and 3B, an asterisk (*) attached to a sample number indicates a Comparative Example.

The sample S01 in FIGS. 3A and 3B is a Comparative Example composed of a first crystal phase alone. In preparing sample S01, each of $K_2CO_3$ powder, $Na_2CO_3$ powder, $Li_2CO_3$ powder and $Nb_2O_5$ powder was first weighed so that each of the coefficients a, b, c and e in the compositional formula of the first crystal phase became the amount ratio in FIG. 3A. Then, ethanol was added to these powders and the entire mixture was wet mixed in a ball mill for 15 hours to obtain a slurry. Thereafter, a mixed powder obtained by drying the slurry was calcined under an air atmosphere at 600° C. to 1,100° C. for 1 to 10 hours to form a calcined product. The calcined product was pulverized and mixed in a ball mill after adding a dispersant, a binder and ethanol to form a slurry. Then, the slurry was dried, granulated, and subjected to uniaxial pressing under a pressure of 20 MPa for molding into a disk (diameter: 20 mm, thickness: 2 mm) shape. Thereafter, a CIP treatment was performed under a pressure of 150 MPa and, after the obtained CIP pressed body was subjected to binder removal, it was maintained under an air atmosphere at 1,150° C. for 7 hours to achieve firing.

Samples S02 to S23 are compositions containing both the first crystal phase and the second crystal phase. Samples S02 to S23 are classified into a first group (samples S02 to S12) and a second group (samples S13 to S23). In samples S02 to S12 of the first group, the composition of the first crystal phase and the composition of the second crystal phase are the same as each other and only the sub-phase ratio (% by volume) is different. Also, in samples S13 to S23 of the second group, the composition of the first crystal phase and the composition of the second crystal phase are the same as each other and only the sub-phase ratio (% by volume) is different. The characteristics in composition of the main phase and the sub-phase are as follows in each group.

<First Group (Samples S02 to S12)>
(1) The element E of the main phase includes Fe and Mg.
(2) The element B of the sub-phase includes Ti, Nb, Fe and Mg.
<Second Group (Samples S13 to S23)>
(1) The element E of the main phase does not include Fe but includes Mg alone.
(2) The element B of the sub-phase does not include Fe but includes Ti, Nb and Mg.

The sub-phase ratio of the first group (samples S02 to S12) ranges from 0.10% by volume to 5.30% by volume. The sub-phase ratio of the second group (samples S13 to S23) ranges from 0.10% by volume to 5.60% by volume. The sintered compacts of these samples S02 to S23 were prepared according to the aforementioned processes T110 to T160 in FIG. 1. Incidentally, the shape after molding in the process T150 was controlled to a disk (diameter: 20 mm, thickness: 2 mm) shape.

The coefficients f1, f2 and f3 in FIG. 3A represent the coefficients of 1 to 3 elements shown in the column of the element D, respectively. For example, as for sample S01, only one element Nb is shown in the column of the element D and the coefficient f1 is the coefficient of the element Nb. Also, as for sample S02, three elements Nb, Ti and Zr are shown in the column of the element D and the coefficient f1 is the coefficient of the first element Nb in the column of the element D, the coefficient f2 is the coefficient of the second element Ti, and the coefficient f3 is the coefficient of the third element Zr. Such relations are the same for the coefficients g1, g2 and g3 of the element E. Also, the same applies to FIG. 6A, FIG. 7A, and the like described below.

For samples S01 to S23, the treatments of the processes T170 to T190 were performed to prepare piezo-electric elements 200 (FIG. 2), respectively. For the thus-obtained piezo-electric element 200 of each sample, the sub-phase ratio, electrical characteristics (relative dielectric constant $\epsilon_{33}^T 68_0$), piezo-electric characteristics (piezo-electric constant $d_{33}$ and electromechanical coupling coefficient kr), presence of room-temperature phase transition point, and polarizability under high electric field were measured, and the results shown in FIG. 3B were obtained. The coefficient h of the sample S01 was 3.0. The coefficients h of samples S02 to S23 fell within the range of 3.0 to 3.1. Further, when the structure of samples S02 to S23 was analyzed by X-ray diffraction, the second crystal phase was confirmed to have a layered structure in all samples.

Samples S02 to S23 are all preferable in that the relative dielectric constant $\epsilon_{33}^T/\epsilon_0$ is sufficiently large, as compared with sample S01 of the Comparative Example. As for the piezo-electric constant $d_{33}$ and the electromechanical coupling coefficient kr, samples S03 to S11 and S14 to S22 are preferable in that they have a sufficiently large value as compared with sample S01 of the Comparative Example. However, samples S02 and S13 are slightly inferior to sample S01 and samples S12 and S23 are equal to sample S01.

Figure 4:
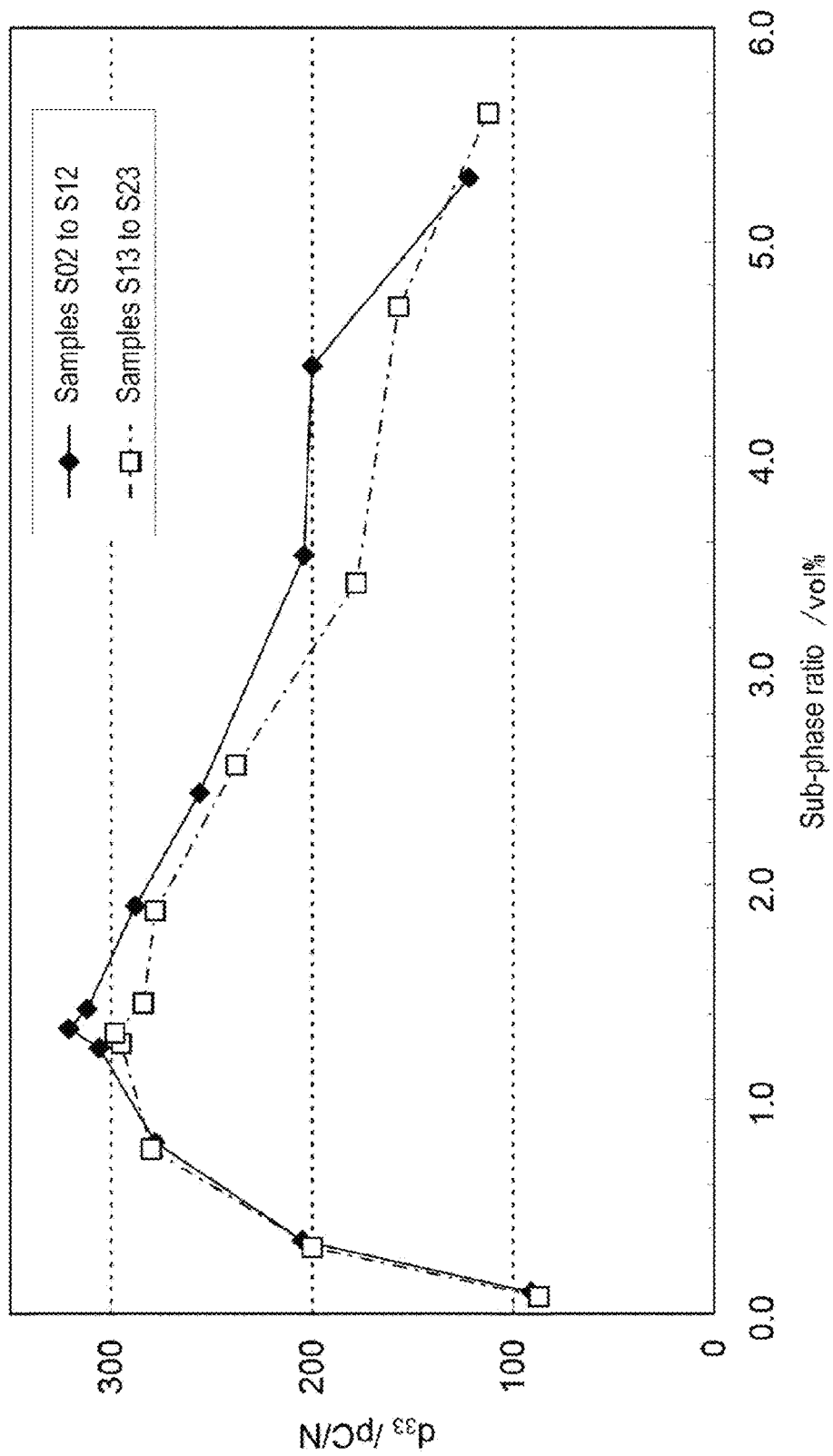
FIG. 4 is a graph showing a relationship between the sub-phase ratio and the piezo-electric constant $d_{33}$.

The graph of FIG. 4 shows the relationship between the sub-phase ratio and the piezo-electric constant $d_{33}$ relating to the first group (samples S02 to S12) and the second group (samples S13 to S23). Black diamond-shaped plots show the results of the first group (samples S02 to S12) and outline square plots show the results of the second group (samples S13 to S23). As understood from the graph, from the viewpoint of the piezo-electric constant $d_{33}$, the sub-phase ratio is preferably in the range of 0.30% by volume or more to 10% by volume or less, more preferably in the range of 0.50% by volume or more to 2.50% by volume or less, and most preferably in the range of 1.00% by volume or more to 2.00% by volume or less. The preferable range of the sub-phase ratio is about the same also from the viewpoint of the electromechanical coupling coefficient kr.

In a typical example, particularly important characteristics associated with a piezo-electric element are the piezo-electric constant $d_{33}$ and the electromechanical coupling coefficient kr. Therefore, the sub-phase ratio of the piezo-electric porcelain composition to be used for the piezo-electric element is preferably in the range of 0.30% by volume or more to 10% by volume or less, more preferably in the range of 0.50% by volume or more to 2.50% by volume or less, and most preferably in the range of 1.00% by volume or more to 2.00% by volume or less. However, among three characteristics of the relative dielectric constant $\epsilon_{33}^{T}/\epsilon_0$, the piezo-electric constant $d_{33}$ and the electromechanical coupling coefficient kr, important one(s) may vary depending on the use of the porcelain composition in some cases. For example, a composition having large relative dielectric constant $\epsilon_{33}^{T}/\epsilon_0$ is suitable for condensers. Moreover, a composition having a large piezo-electric constant $d_{33}$ is suitable for actuators and sensors. Furthermore, a composition having a large electromechanical coupling coefficient kr is suitable for piezo-electric transformers and actuators. A piezo-electric porcelain composition suitable for each use is determined according to the characteristic(s) required by a particular application.

The second column from the right end of FIG. 3B shows the results of an evaluation test relating to the presence of the room-temperature phase transition point for samples S01 to S23. As for the evaluation test at the presence of a room-temperature phase transition point, the relative dielectric constant $\epsilon_{33}^{T}/\epsilon_0$ was measured while the environmental temperature was gradually changed in the range of −50° C. to ±150° C. In general, a piezo-electric porcelain composition having a phase transition point within a certain temperature range shows a sharp change where the relative dielectric constant $\epsilon_{33}^{T}/\epsilon_0$ has a definite peak, according to the temperature change within the range. On the other hand, as for the piezo-electric porcelain composition having no phase transition point within the temperature range, no definite peak appears on the change in the relative dielectric constant $\epsilon_{33}^{T}/\epsilon_0$ and the change is gradual. Therefore, from the change in the relative dielectric constant $\epsilon_{33}^{T}/\epsilon_0$ at the time when the temperature was gradually changed in the range of −50° C. to +150° C., a judgment was made as to whether the phase transition point was definitely observed or not. Further, according to the result, a judgment was made as to whether a "room-temperature phase transition point" was present or not. The phrase "room-temperature" as used herein here means a wider temperature range than usual room temperature (25° C.).

In the sample S01 of the Comparative Example, the room-temperature phase transition point was observed. On the other hand, in samples S02 to S23, the room-temperature phase transition point was not observed in all cases. When the room-temperature phase transition point is present, the electrical characteristics and the piezo-electric characteristics of the piezo-electric porcelain composition change to a large degree, so that such a case is not preferable. From this viewpoint, samples S02 to S23 containing both the main phase and the sub-phase are more preferable than sample S01 of the Comparative Example in that the room-temperature phase transition point is absent.

Samples S12 and S23 are almost equal to sample S01 of the Comparative Example in view of the piezo-electric constant $d_{33}$ and the electromechanical coupling coefficient kr. Further, samples S02 and S13 have a smaller piezo-electric constant $d_{33}$ and electromechanical coupling coefficient kr than those of sample S01 of the Comparative Example, but the room-temperature phase transition point is absent and the relative dielectric constant $\epsilon_{33}^{T}/\epsilon_0$ is larger than that of sample S01. Therefore, samples S12, S23, S02 and S13 are more preferable than sample S01 in applications where the relative dielectric constant $\epsilon_{33}^{T}/\epsilon_0$ is important and the presence of the room-temperature phase transition point becomes a problem (e.g., condenser uses).

The right-end column of FIG. 3B shows the results of an evaluation test relating to polarizability under a high electric field for samples S01 to S23. The evaluation test was performed by applying an electric field of 4 kV/mm at a temperature of 80° C. for 30 minutes in a state in which a piezo-electric element 200 using a disk-shaped piezo-electric porcelain 100 (FIG. 2) having a diameter of 10 mm and a thickness of 1 mm was immersed in an insulating oil. When leakage current at electric field application was 0.5 mA or less, the case was graded as qualified (shown by a mark "□" in FIG. 3B) and when the current exceeded 0.5 mA, the case was graded as disqualified (shown by a mark "□" in FIG. 3B). In samples S02 to S23 of the Examples, the leakage current was 0.5 mA in all cases. Further, these samples were also confirmed to have sufficiently excellent polarizability under a high electric field.

FIG. 5 shows reflected electron images of samples S01 and S07 taken by EPMA (electron beam microanalyzer) for comparison. In the electron image of sample S01, a large number of voids (regions near to black) are observed, in addition to the region of the main phase (gray region). Namely, in sample S01 of the Comparative Example, a considerably large number of voids are present in the main phase. It is surmised that the voids are spaces generated between a large number of fine crystal grains that form the main phase. On the other hand, in the electron image of sample S07, the voids are extremely small, and instead, the regions of the sub-phase (second crystal phase) (region having a color density between the void and the main phase) are observed. In sample S07, since the voids are filled with the sub-phase, it is understood that the voids are hardly present.

As above, in the piezo-electric porcelain composition wherein the voids formed in the main phase are filled with the sub-phase, the crystal grains of the main phase are strongly bound to one another by the sub-phase. As a result, it is surmised that the piezo-electric constant $d_{33}$ and the electromechanical coupling coefficient kr have extremely large values. As understood from FIG. 3B, in samples S05 to S08 and S16 to S19 in which the sub-phase ratio is from 1.00 to 2.00% by volume, the piezo-electric constant $d_{33}$ and the electromechanical coupling coefficient kr are largest. It is surmised that the reason is that, during the increase in the sub-phase ratio from 0% by volume to 1.00% by volume, since the filling rate of the voids in the main phase gradually increases according to the increase in the sub-phase ratio, the piezo-electric constant $d_{33}$ and the electromechanical coupling coefficient kr also gradually increase. On the other hand, when the sub-phase ratio is further increased to exceed 2.00% by volume, it is surmised that, since the filling rate of the voids is not so changed and the ratio of the main phase having piezo-electric characteristics decreases, the piezo-electric constant $d_{33}$ and the electromechanical coupling coefficient kr gradually decrease.

The sub-phase ratio (% by volume) of samples S02 to S23 in FIGS. 3A and 3B was measured as follows using the above described reflective electron images. First, the sintered compact of each sample was mirror-polished and subjected to a conduction treatment and subsequently, a reflective electron image of 1,000 magnifications was photographed by an electron probe microanalyzer (EPMA). On this occasion, reflection electron images at 10 places were photographed per one sample The thus-obtained reflection electron images are expressed with eight gradations and are separated into three regions of the first crystal phase, the second crystal phase, and the voids depending on the gradation. Thereafter, the area ratio of the second crystal phase was measured using image analyzing software. Then, an average value of the area ratios of the second crystal phase in eight sheets of images excluding the image in which the area ratio of the second crystal phase is maximum and the image in which the area ratio of the second crystal phase is minimum was adopted as the area ratio of the second crystal phase in the sample. The thus-obtained area ratio of the second crystal phase was used as the volume ratio (sub-phase ratio) of the second crystal phase. In the present embodiment, as the image analyzing software, WinROOF manufactured by Mitani Corporation was used. The ratio of the third crystal phase in the case where the sub-phase contains the third crystal phase can also be measured in the same manner. The element ratio of each crystal phase was measured by EPMA-WDS (wavelength dispersion type X-ray spectrometer) or EPMA-EDS (energy dispersion type X-ray spectrometer).

FIGS. 6A and 6B include experimental results showing the influence of the coefficient e in the compositional formula of the main phase on the characteristics of the piezo-electric porcelain composition. In samples S24 to S30, among the coefficients a to h in the compositional formula of the main phase, only the coefficient e (number of the alkaline elements at the A site) is different among the samples and the other coefficients are constant over the entirety of samples S24 to S30. Moreover, the composition of the sub-phase (second crystal phase) is $(K,Na,Li)_2(Ti,Nb,Fe,Mg)_6O_{13}$ in all samples and the sub-phase ratio was 1.5% by volume, which was held constant. For the piezo-electric elements 200 of samples S24 to S30, electrical characteristics (relative dielectric constant $\epsilon_{33}^T/\epsilon_0$ and dielectric loss tans), piezo-electric characteristics (piezo-electric constant $d_{33}$ and electromechanical coupling coefficient kr, kt, mechanical quality coefficient Qm), and Curie point were measured to obtain the results shown in FIG. 6B. In FIG. 6B "N/A" means that the value was not measured.

Samples S24 to S30 are all preferable in that the relative dielectric constant $\epsilon_{33}^T/\epsilon_0$ and the piezo-electric constant $d_{33}$ are sufficiently large as compared with sample S01 of the Comparative Example. Particularly, the piezo-electric constant $d_{33}$ is 280 pC/N or more and, considering that the piezo-electric constant $d_{33}$ of the piezo-electric porcelain composition of Patent Document 1 is at most about 250 pC/N, it is understood that the samples are extremely excellent with respect to the piezo-electric constant $d_{33}$. Furthermore, samples S24 to S30 are preferable in that the electromechanical coupling coefficient kr is sufficiently large and the Curie point is 300° C. or higher, and thus is also sufficiently high. From the viewpoints of the relative dielectric constant $\epsilon_{33}^T/\epsilon_0$ and the piezo-electric constant $d_{33}$, the value of coefficient e in the compositional formula of the main phase is preferably $0.80 \leq e \leq 1.30$, further preferably $0.80 \leq e \leq 1.25$, and most preferably $1.00 \leq e \leq 1.15$.

FIGS. 7A and 7B include experimental results showing the influence of metal species of the second crystal phase and the presence of the third crystal phase on the characteristics of the piezo-electric porcelain composition. In the upper part of FIGS. 7A and 7B, the compositions and characteristics of samples S18 and S07 are also listed again. In samples S18, S07 and S31 to S36, the element B of the second crystal phase is different among the samples. More specifically, samples S18, S07 and S31 to S36 are common in that they contain three metal elements of Ti, Nb and Mg as the element B of the second crystal phase, but are different from each other in that samples S07 and S31 to S36 excluding the sample S18 contain any of Re, Co, Zn, Mn, Al, Ni and (Fe+Zn), in addition to the three metal elements Ti, Nb and Mg. As shown in FIG. 7B, sample S37 is common to sample S36 in that it contains five metal elements Ti, Nb, Fe, Zn and Mg as the element B of the second crystal phase, but is different from sample S36 in that the sub-phase contains the third crystal phase composed of $K(Zn,Ti)O_2$. Furthermore, sample S38 is common to sample S36 in that it contains four metal elements Ti, Nb, Fe and Mg as the element B, but is different from sample S36 in that the sub-phase contains the third crystal phase composed of $(Ba,Ba,K)_3(Nb,Fe)_5O_{15}$. Incidentally, the third crystal phases of samples S37 and S38 precipitate as a result of preparing piezo-electric porcelain compositions in accordance with the processes of FIG. 1 and the compositions of the first crystal phase and the second crystal phase given in FIGS. 7A and 7B. As shown in FIG. 7B, since the volume ratio of the third crystal phase is 0.20% or less of the entire piezo-electric porcelain composition and is extremely small, the change in composition of the first crystal phase and the second crystal phase by precipitation of the third crystal phase is practically negligible.

As shown in FIG. 7B, as for samples S18, S07 and S31 to S38, the relative dielectric constant $\epsilon_{33}^T/\epsilon_0$, the dielectric loss tans, the piezo-electric constant $d_{33}$, the electromechanical coupling coefficient kr, kt, the mechanical quality coefficient Qm, and the Curie point were measured. Samples S18, S07 and S31 to S38 were found to also have excellent characteristics in all these points. Therefore, it is considered that the influence of the difference of metal species of the element B of the second crystal phase on these characteristics is relatively small. Moreover, also in the case where the sub-phase contains the third crystal phase, it is possible to obtain sufficiently good characteristics.

Various samples of the Examples shown in FIGS. 3A, 3B, 6A, 6B, 7A and 7B contained three metal elements of K, Na and Li as the element A of the second crystal phase. Element A need not necessarily contain all the metal elements K, Na and Li, but preferably contains at least one thereof. Moreover, various samples of the above Examples further contained three metal elements Ti Nb and Mg as the element B of the second crystal phase. Element B need not necessarily contain all the metal elements Ti, Nb and Mg but preferably contains at least one selected from Co, Fe, Mg, Ni, Zr, Zn, Mn, Al, Nb, Ta, W and Ti. Moreover, the element B of the second crystal phase further preferably contains at least Mg.

FIG. 8 is a figure showing the results of a thermal cycle test. Here, for samples S01, S06 and S17 of the Comparative Examples described in FIGS. 3A and 3B and sample S36 described in FIGS. 7A and 7B, a change in the piezo-electric constant $d_{33}$ after the thermal cycle test is shown. The thermal cycle test was carried out in the following manner (i) A piezo-electric element is placed in a thermostatic chamber and the piezo-electric characteristic is evaluated (initial value).

(ii) Next, a thermal cycle of changing temperature from −50° C. to +150° C. at a temperature-changing rate of 2° C./minute is repeated 1,000 times (holding time at −50° C. and +150° C. is 1 hour).

(iii) Thereafter, the piezo-electric characteristic is again evaluated at room temperature (value of the characteristic after thermal cycles).

In sample S01 of the Comparative Example, the piezo-electric constant $d_{33}$ was decreased by 34% in the thermal cycle test. On the other hand, in samples S06, S17 and S36, the piezo-electric constant $d_{33}$ was decreased only by about 6% in the thermal cycling test and the decrease ratio was sufficiently small. Thus, piezo-electric porcelain compositions containing the second crystal phase of the $A_2B_6O_{13}$-based compound are also excellent in durability in thermal cycling.

Figure 9:
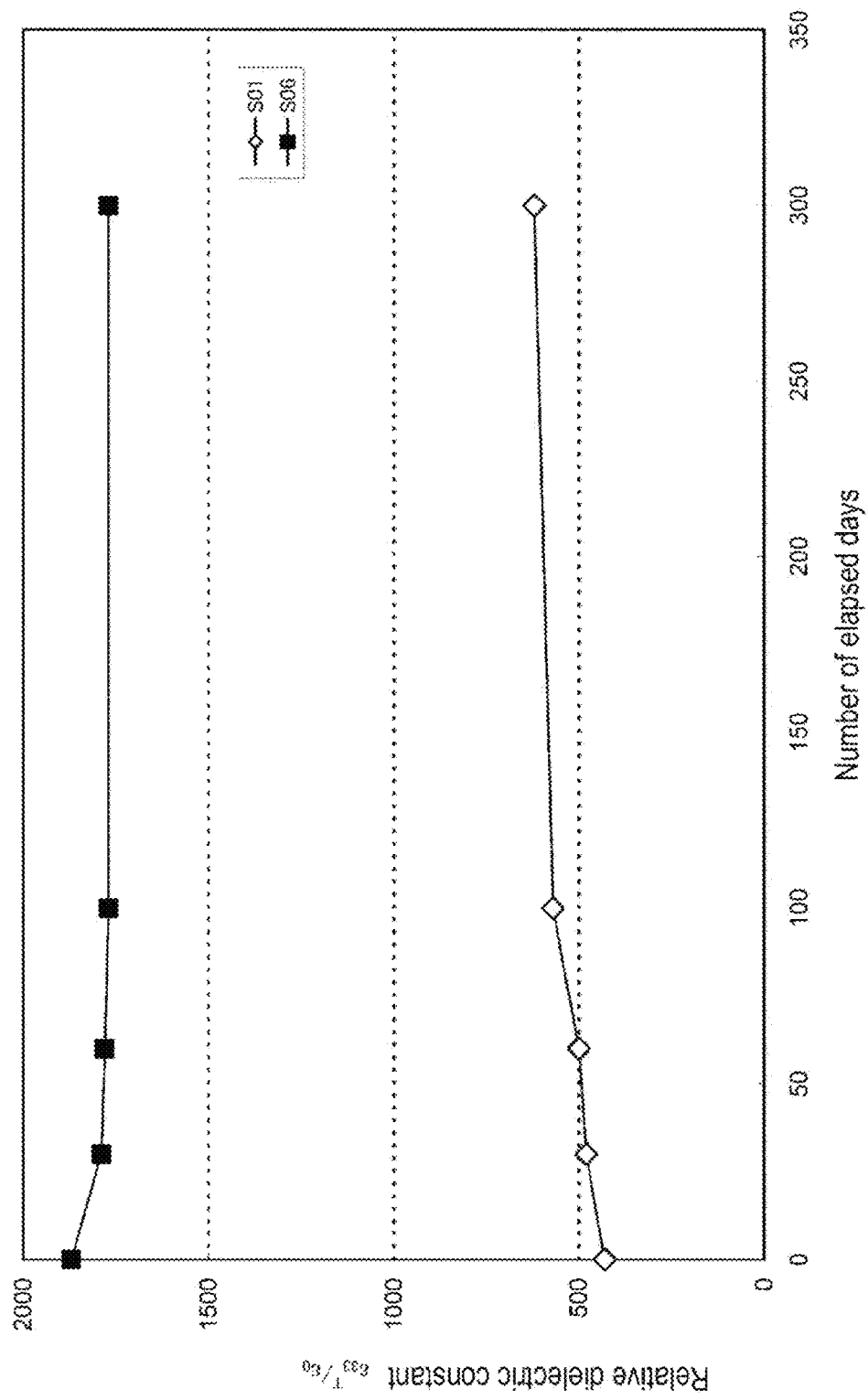
FIG. 9 is a graph showing the time course of the relative dielectric constant.
Figure 10:
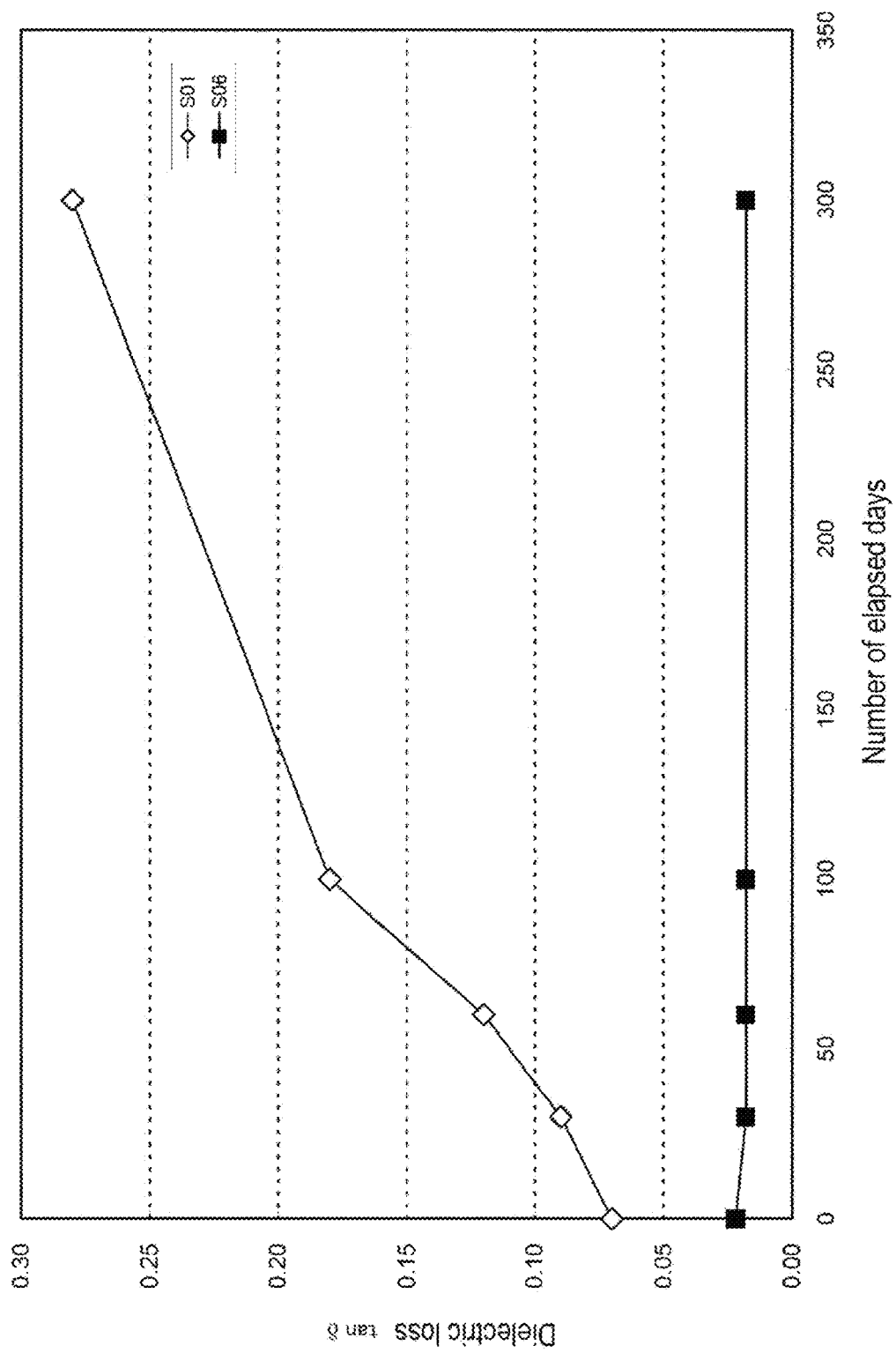
FIG. 10 is a graph showing the time course of the dielectric loss.

FIG. 9 is a graph showing the time course of the relative dielectric constant $\epsilon_{33}^T/\epsilon_0$, and FIG. 10 is a graph showing the time course of the dielectric loss tanδ. In these figures, for the samples S01 and S06 described in FIGS. 3A and 3B, a profile of changing the relative dielectric constant $\epsilon_{33}^T/\epsilon_0$ and the dielectric loss tanδ with the lapse of time is shown. As for the elapsed days, the day after a depolarization treatment (process T190 in FIG. 1) was carried out is taken as the 0th day. Sample S06 of the Examples is preferable as compared to sample S01 of the Comparative Example in that a change in the piezo-electric constant $d_{33}$ and the dielectric loss tanδ with the lapse of time is small and the characteristics are more stable. It is surmised that the reason why the values of the characteristics of sample S06 are more stable than those of sample S01 is that a large number of voids in the main phase are filled with the sub-phase in sample S06 while a large number of voids are present in the main phase of sample S01. Thus, the samples of the Examples of the invention are also excellent in that their characteristics are less prone to deteriorate with the lapse of time.

The invention has been described in detail with reference to the above embodiments. However, the invention should not be construed as being limited thereto. It should further be apparent to those skilled in the art that various changes in form and detail of the invention as shown and described above may be made. It is intended that such changes be included within the spirit and scope of the claims appended hereto.

What is claimed is:

1. A lead-free piezo-electric porcelain composition comprising:
   a main phase having voids and which is formed of a first crystal phase composed of an alkali niobate/tantalate-based perovskite oxide having piezo-electric characteristics; and
   a sub-phase containing a second crystal phase composed of an $A_2B_6O_{13}$-based compound, where the element A is a monovalent element and the element B is one or more divalent to hexavalent elements,
   wherein the sub-phase fills the voids present in the main phase.

2. The lead-free piezo-electric porcelain composition as claimed in claim 1, wherein the element A includes at least one metal element selected from the group consisting of Li, Na and K and the element B includes at least one metal element selected from the group consisting of Co, Fe, Mg, Ni, Zr, Zn, Mn, Al, Nb, Ta, W and Ti.

3. The lead-free piezo-electric porcelain composition as claimed in claim 1, wherein the element B includes at least Mg.

4. The lead-free piezo-electric porcelain composition as claimed in claim 1, wherein the $A^2B_6O_{13}$-based compound has a layered structure.

5. The lead-free piezo-electric porcelain composition as claimed in claim 1, wherein the content ratio of the second crystal phase in the lead-free piezo-electric porcelain composition is any of the following:
   (i) 0.30% by volume or more and 3.10% by volume or less,
   (ii) 0.50% by volume or more and 2.50% by volume or less, and
   (iii) 1.00% by volume or more and 2.00% by volume or less.

6. The lead-free piezo-electric porcelain composition as claimed in claim 1, wherein the volume ratio of the second crystal phase is larger than 50% when the whole of the sub-phase is taken as 100%.

7. The lead-free piezo-electric porcelain composition as claimed in claim 1, Wherein the alkali niobate/tantalate-based perovskite oxide forming the first crystal phase contains an alkaline earth metal.

8. The lead-free piezo-electric porcelain composition as claimed in claim 1, wherein the alkali niobate/tantalate-based perovskite oxide forming the first crystal phase is represented by a compositional formula $(K_aNa_bLi_cC_d)_e(D_fE_g)O_h$, where the element C is one or more selected from the group consisting of Ca, Sr, Ba, and Rb, the element D is one or more, including at least Nb or Ta, selected from the group consisting of Nb, Ta, Ti and Zr, the element E is one or more selected from the group consisting of Mg, Al, Sc, Mn, Fe, Co, Ni, Zn, Ga and Y, a+b+c+d=1, e is any value, f+g=1, and h is any value that forms a perovskite.

9. The lead-free piezo-electric porcelain composition as claimed in claim 8, wherein the coefficient e satisfies 0.80≤e≤1.30.

10. A piezo-electric element comprising:
    a piezo-electric porcelain formed of the lead-free piezo-electric porcelain composition as claimed in claim 1, and
    an electrode attached to the piezo-electric porcelain.

11. A method for producing the lead-free piezo-electric porcelain composition as claimed in claim 1, the method comprising:
    mixing and calcining constituent raw materials of the first crystal phase to form a first powder,
    mixing and calcining constituent raw materials of the second crystal phase to form a second powder, and
    forming the lead-free piezo-electric porcelain composition by mixing the first powder and the second powder, molding to form a green body and firing,
    wherein the firing is closed firing performed while the green body is enclosed in a closed vessel.

* * * * *